(12) United States Patent
Lim et al.

(10) Patent No.: US 9,136,215 B2
(45) Date of Patent: Sep. 15, 2015

(54) MANUFACTURING METHOD FOR SEMICONDUCTOR PACKAGE

(75) Inventors: Shoa Siong Lim, Singapore (SG); Klan Hock Lim, Singapore (SG)

(73) Assignee: ADVANPACK SOLUTIONS PTE. LTD., Kallang (SG)

( * ) Notice: Subject to any disclaimer, the term of this patent is extended or adjusted under 35 U.S.C. 154(b) by 0 days.

(21) Appl. No.: 13/127,061

(22) PCT Filed: Nov. 6, 2009

(86) PCT No.: PCT/SG2009/000408
§ 371 (c)(1),
(2), (4) Date: May 2, 2011

(87) PCT Pub. No.: WO2010/053452
PCT Pub. Date: May 14, 2010

(65) Prior Publication Data
US 2011/0210442 A1      Sep. 1, 2011

Related U.S. Application Data

(60) Provisional application No. 61/112,207, filed on Nov. 7, 2008.

(51) Int. Cl.
*H01L 23/485* (2006.01)
*H01L 21/56* (2006.01)
(Continued)

(52) U.S. Cl.
CPC .... *H01L 23/49861* (2013.01); *H01L 23/49822* (2013.01); *H01L 24/32* (2013.01);
(Continued)

(58) Field of Classification Search
CPC ........ H01L 23/485; H01L 21/56; H01L 21/78

USPC ................. 257/737, 698, 701, 706, 707, 778, 257/E23.021, E21.502, E21.599; 438/127, 438/113, 121
See application file for complete search history.

(56) References Cited

U.S. PATENT DOCUMENTS 3,405,442 A      10/1968   Caracciolo
5,355,283 A  *  10/1994   Marrs et al. ................... 361/760
(Continued)

FOREIGN PATENT DOCUMENTS

DE        1227965 B      11/1966
DE        10235332 A1     2/2004
DE        10333840 A1     2/2005

OTHER PUBLICATIONS

The International Search Report and Written Opinion dated Dec. 30, 2009.

(Continued)

*Primary Examiner* — Sheng Zhu
(74) *Attorney, Agent, or Firm* — McClure, Qualey & Rodack, LLP

(57) ABSTRACT

A manufacturing method includes the follow steps. Firstly, a carrier is provided. Then, a plurality of traces are formed on the carrier. Then, a trace molding compound layer is formed on the carrier by a first molding process. Then, the carrier is removed from the trace molding compound layer to expose an etched surface of the trace molding compound layer and trace upper surfaces of the traces. Then, at least a chip is disposed on the etched surface of the trace molding compound layer and the chip is connected to the trace upper surfaces. Then, a chip molding compound layer is formed on the etched surface by a second molding process substantially similar to the first molding process, wherein the chip molding compound layer and the trace molding compound layer are formed of substantially the same molding compound material.

13 Claims, 18 Drawing Sheets

(51) Int. Cl.
H01L 21/78 (2006.01)
H01L 23/498 (2006.01)
H01L 23/00 (2006.01)

(52) U.S. Cl.
CPC .............. H01L 24/49 (2013.01); H01L 24/97 (2013.01); H01L 24/28 (2013.01); H01L 24/45 (2013.01); H01L 24/48 (2013.01); *H01L 2224/2919* (2013.01); *H01L 2224/32225* (2013.01); *H01L 2224/32245* (2013.01); *H01L 2224/45144* (2013.01); *H01L 2224/48091* (2013.01); *H01L 2224/48227* (2013.01); *H01L 2224/48247* (2013.01); *H01L 2224/4943* (2013.01); *H01L 2224/73265* (2013.01); *H01L 2224/97* (2013.01); *H01L 2924/014* (2013.01); *H01L 2924/01015* (2013.01); *H01L 2924/01028* (2013.01); *H01L 2924/01029* (2013.01); *H01L 2924/01033* (2013.01); *H01L 2924/01046* (2013.01); *H01L 2924/01079* (2013.01); *H01L 2924/01082* (2013.01)

(56) References Cited

U.S. PATENT DOCUMENTS

| | | | |
|---|---|---|---|
| 5,976,912 A | 11/1999 | Fukutomi et al. | |
| 6,172,419 B1 * | 1/2001 | Kinsman | 257/737 |
| 6,359,341 B1 * | 3/2002 | Huang et al. | 257/778 |
| 6,555,917 B1 * | 4/2003 | Heo | 257/777 |
| 6,573,595 B1 * | 6/2003 | Chen et al. | 257/698 |
| 6,737,750 B1 * | 5/2004 | Hoffman et al. | 257/777 |
| 6,870,249 B2 * | 3/2005 | Egawa | 257/686 |
| 6,927,485 B2 * | 8/2005 | Lai et al. | 257/686 |
| 6,965,157 B1 * | 11/2005 | Perez et al. | 257/666 |
| 6,975,022 B2 * | 12/2005 | Sakamoto et al. | 257/676 |
| 7,411,287 B2 * | 8/2008 | Ding | 257/692 |
| 7,521,794 B2 * | 4/2009 | Yee et al. | 257/720 |
| 7,598,122 B1 * | 10/2009 | Bayan et al. | 438/112 |
| 8,022,532 B2 * | 9/2011 | Kasuya et al. | 257/707 |
| 8,111,523 B2 * | 2/2012 | Sunohara et al. | 361/781 |
| 2005/0287711 A1 | 12/2005 | Huang et al. | |
| 2007/0001278 A1 | 1/2007 | Jeon et al. | |
| 2007/0161157 A1 | 7/2007 | Islam et al. | |
| 2007/0289127 A1 * | 12/2007 | Hurwitz et al. | 29/827 |
| 2008/0265400 A1 * | 10/2008 | Pan et al. | 257/698 |
| 2009/0115050 A1 * | 5/2009 | Kasuya et al. | 257/701 |

OTHER PUBLICATIONS

Chinese language office action dated Jul. 20, 2012.
TW Office Action dated Nov. 30, 2012.

* cited by examiner

MANUFACTURING METHOD FOR SEMICONDUCTOR PACKAGE

CROSS REFERENCE TO RELATED APPLICATION

This application is the 35 U.S.C. §371 national stage of PCT application PCT/SG2009/000408, filed Nov. 6, 2009, claiming priority of U.S. Provisional Patent Application 61/112,207, filing date Nov. 7, 2008, herein incorporated by reference in their entirety.

BACKGROUND OF THE INVENTION

1. Field of the Invention

The invention relates in general to a manufacturing method for a semiconductor package, and more particularly to a manufacturing method for a semiconductor package with enhanced routing design flexibility.

2. Description of the Related Art

Referring to FIG. 1, a conventional Quad-Flat Pack (QFN) semiconductor package is shown. The semiconductor package 10 includes a chip 12, a lead frame 14, a plurality of wires 16, a chip base 18, a chip supporting studs 20 and an adhesive 24. The lead frame 14 located on the peripheral of the semiconductor package 10 is exposed from the bottom surface of the semiconductor package 10 to be used as an I/O contact of the semiconductor package 10. The chip 12 is disposed on the chip base 18. The chip base supporting stud 20 supports the chip base 18 to enhance the structural strength of the semiconductor package 10.

However, the wires 16, extended around the semiconductor package 10, are too long and exposed to the risk of short-circuiting. Besides, the lead frame 14, being used as an I/O contact, can only be disposed on the peripheral of the semiconductor package 10, hence limiting the number of the I/O contacts of the semiconductor package 10. Consequently, increasing the number of I/O contacts substantially increases the size of the semiconductor package. Moreover, the lead frame 14 being used as an I/O contact is exposed in the air, and is susceptible to the erosion by the environment.

SUMMARY OF THE INVENTION

The invention is directed to a semiconductor package and a method for manufacturing the semiconductor package and a trace substrate and a method for manufacturing the trace substrate. The semiconductor package includes a plurality of trace pads, a plurality of wires, a plurality of conductive studs and a molding compound. The trace pads can be disposed near the chip, so that the wire connects the chip and the trace pad via a shortest distance to reduce the risk of wire-crossing and short-circuiting. Besides, the trace pads of the semiconductor package are not limited to be disposed on the peripheral of the semiconductor package, so the number of the I/O contacts of the semiconductor package can be greatly increased. Moreover, the trace pads and the conductive studs are protected inside the molding compound, and will not be eroded easily.

According to a first aspect of the present invention, a manufacturing method for a semiconductor package a semiconductor package is provided. The manufacturing method includes the follow steps. A carrier having a carrier upper surface and a carrier lower surface opposite the carrier upper surface is provided; a plurality of traces are formed on the carrier, wherein each trace has a trace upper surface and a trace lower surface opposite the trace upper surface, and the trace upper surface adjoins the carrier lower surface; a plurality of studs are formed on the plurality of traces, wherein each stud has a stud upper surface and a stud lower surface opposite the stud upper surface, and the stud upper surface adjoins the trace lower surface; a trace molding compound layer is formed on the carrier by a first molding process, wherein the trace molding compound layer has a first surface and a second surface opposite the first surface, and the trace molding compound layer encapsulates the plurality of traces and studs between the first and second surface of the trace molding compound layer, the first surface of the trace molding compound layer adjoins the carrier lower surface; the carrier is removed from the trace molding compound layer to expose an etched surface of the trace molding compound layer and the trace upper surface; at least a chip is disposed on the etched surface of the trace molding compound layer and the chip is connected to the trace upper surface; a chip molding compound layer is formed on the etched surface of the trace molding compound layer by a second molding process substantially similar to the first molding process, wherein the chip molding compound layer has a first surface and a second surface opposite the first surface, and the chip molding compound layer encapsulates the chip between the first and second surface of the chip molding compound layer, the second surface of the chip molding compound layer adjoins the etched surface of the trace molding compound layer and the trace upper surface, and the chip molding compound layer and the trace molding compound layer are formed of substantially the same molding compound material.

According to a second aspect of the present invention, a manufacturing method for a semiconductor package is provided. The manufacturing method includes the following steps. A carrier having a carrier upper surface and a carrier lower surface opposite the carrier upper surface is provided; a plurality of traces are formed on the carrier, wherein each trace has a trace upper surface and a trace lower surface opposite the trace upper surface, and the trace upper surface adjoins the carrier lower surface; a plurality of studs on the plurality of traces are formed, wherein each stud has a stud upper surface and a stud lower surface opposite the stud upper surface, and the stud upper surface adjoins the trace lower surface; a trace molding compound layer is formed on the carrier by a first molding process, wherein the trace molding compound layer has a first surface and a second surface opposite the first surface, and the trace molding compound layer encapsulates the plurality of traces and the studs between the first and second surface of the trace molding compound layer, the first surface of the trace molding compound adjoins the carrier lower surface; the carrier is removed from the trace molding compound layer to expose an etched surface of the trace molding compound layer and the trace upper surface; at least a chip is provided; a chip molding compound layer is formed, wherein the chip molding compound layer has a first surface and a second surface opposite the first surface, and the chip molding compound layer encapsulates the chip between the first and second surface of the chip molding compound layer; the chip molding compound layer is disposed on the etched surface of the trace molding compound layer, wherein the second surface of the chip molding compound layer adjoins the first surface of the trace molding compound layer and the trace upper surface, the chip molding compound layer and the trace molding compound layer are formed of substantially the same molding compound material.

According to a second aspect of the present invention, a trace substrate is provided. The trace substrate is for disposing a chip. The trace substrate includes a plurality of traces, a plurality of conductive studs, a plurality of traces pads and a trace molding compound. The conductive studs correspondingly are formed on the traces. The trace pads are correspondingly disposed on the traces, wherein the trace pads and their corresponding conductive studs are separated by a distance along an extending direction of the traces. The trace molding compound encapsulates the conductive studs and the traces, and exposes a conductive stud surface of each conductive stud and a trace surface of each trace.

The invention will become apparent from the following detailed description of the preferred but non-limiting embodiments. The following description is made with reference to the accompanying drawings.

DETAILED DESCRIPTION OF THE INVENTION

A number of preferred embodiments are disclosed below for elaborating the invention. However, the disclosures of the embodiments below and their accompanied drawings are for exemplification only, not for limiting the scope of protection of the invention. Moreover, secondary elements are omitted in the embodiments below for highlighting the technical features of the invention.

First Embodiment

Figure 1:
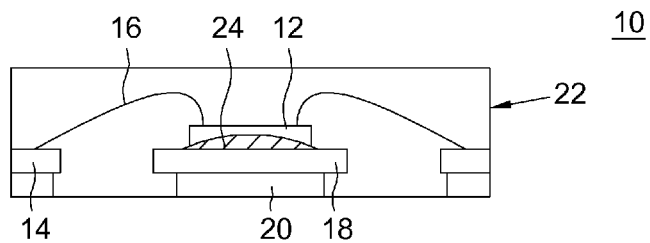
FIG. 1 shows a generally known semiconductor package.
Figure 2A:
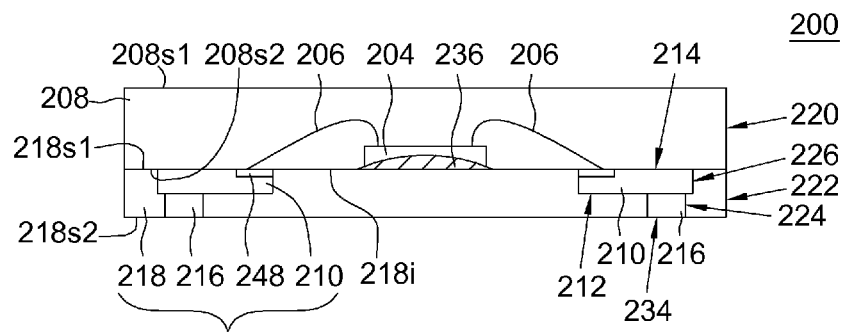
FIG. 2A shows a semiconductor package according to a first embodiment of the invention.

Referring to FIG. 2A, a semiconductor package according to a first embodiment of the invention is shown. The semiconductor package 200 includes a trace substrate 202, a chip 204, a plurality of wires 206, preferably gold wire, a chip molding compound 208, preferably molding compound and an adhesive 236, preferably polymer epoxy. The trace substrate 202 includes a plurality of traces 210, preferably copper traces, a plurality of trace pads 248, preferably copper pads with gold finishing, a plurality of conductive studs 216, preferably copper studs, and a trace molding compound 218, preferably molding compound.

Each trace 210 has a trace lower surface 212 and a trace upper surface 214 opposite to each other. The trace pads 248 are formed on the trace upper surface 214, and the conductive studs 216 are formed on the trace lower surfaces 212. The trace molding compound 218 encapsulates the conductive studs 216 and the traces 210, and exposes a conductive stud lower surface 234 of each conductive stud 216 and the trace upper surface 214. The conductive stud lower surface 234 and the trace upper surface 214 are facing opposite directions.

Preferably, the traces 210, the trace pads 248 and the conductive studs 216 are made from copper and preferably formed by electroplating. Preferably, the trace upper surface 214, the trace pads 248 and the conductive stud lower surface 234 are further coated with electroless nickel/electroless palladium/immersion gold (ENEPIG) for surface protection and enhancing its bondability with another component.

In the present embodiment of the invention, the trace pads 248 are not overlapping to the conductive studs 216. That is, the trace pads 248 and the conductive studs 216 that are disposed on the same trace 210 are separated by a distance along an extending direction (the horizontal direction illustrated in FIG. 2A) of the traces 210.

The trace pads 248 are disposed near the chip 204, so that the wire 206 connects the chip 204 and the trace pads 248 via a shortest distance to avoid the wires 206 crossing and short-circuited. Furthermore, shorter wire length reduces cost of manufacturing.

As indicated in FIG. 2A, the trace pads 248 of the semiconductor package 200 are no more limited to be disposed on the peripheral of the semiconductor package 200, and preferably, be disposed near the chip 204. Preferably, the conductive studs are also disposed within the trace substrate 202. Thus, the number of the I/O contacts of the semiconductor package 200 can be greatly increased. Moreover, the trace pads 248 and the conductive studs 216 are protected inside the molding compound 208, and will not be eroded easily.

Preferably, the traces 210 and the conductive studs 216 are formed by electroplating, and in comparison to the generally known etched lead frame, the traces 210 and the conductive studs 216 can achieve smaller feature sizes and be disposed closer to one another within the trace substrate. Thus, the semiconductor package 200 of the present embodiment of the invention is conformed to the trend of lightweight, compactness and slimness.

In the present embodiment of the invention, the distance from the conductive studs 216 to the lateral side 222 of the trace molding compound 218 is smaller than the distance from the trace pads 248 to the lateral side 222 so as to form a fan-out semiconductor package.

Figure 2B:
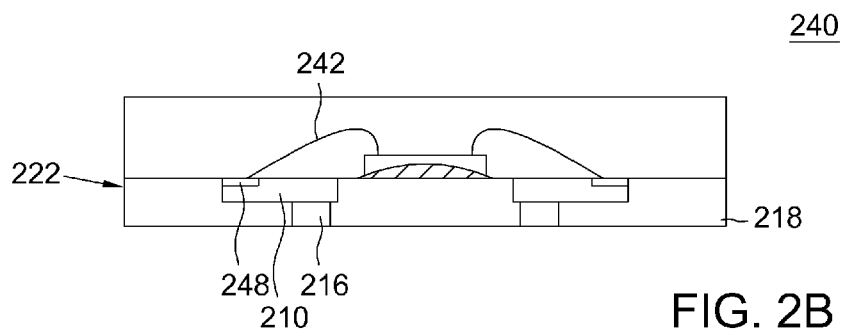
FIG. 2B shows a semiconductor package according to another embodiment of the invention.

Despite the semiconductor package 200 of the present embodiment of the invention is exemplified by a fan-out semiconductor package, the semiconductor package of the invention can also be a fan-in semiconductor package. Referring to FIG. 2B, a semiconductor package according to another embodiment of the invention is shown. The semiconductor package 240 is a fan-in the semiconductor package, and the distance from the conductive studs 216 to the lateral side 222 of the trace molding compound 218 is larger than the distance from the trace pads 248 to the lateral side 222 of the trace molding compound 218. That is, the distance from the conductive studs 216 to the lateral side 222 of the trace molding compound 218 is larger than the distance from the trace pads 248 to the lateral side 222 of the trace molding compound 218 so as to form a fan-in structure.

Return to FIG. 2A, the chip 204 is fixed on the trace substrate 202 with an adhesive 236. In FIG. 2A, the adhesive 236 can be a conductive or an insulating material. When the chip is disposed on a conductive chip base such as the chip base 302 of FIG. 8, the adhesive 236 is preferably made from an insulating material.

The wire 206 electrically connects 204 and the trace pads 248. The trace molding compound 218 has a first insulative surface 218s1 and a second insulative surface 218s2 opposite to the first insulative surface 218s1. The chip molding compound 208 has a first surface 208s1 and a second surface 208s2 opposite to the first surface 208s1. The second surface 208s2 of the chip molding compound 208 adjoins on the first insulative surface 218s1 of the trace molding compound 218 to form an interface 218i between the second surface 208s2 of the chip molding compound 208 and the first insulative surface 218s1 of the trace molding compound 218. The traces 210 encapsulate the chip 204, the adhesive 236 and the wire 206.

The detailed processes of the method for manufacturing the semiconductor package of FIG. 2A are disclosed below. Referring to FIGS. 3A-3J and FIG. 4. FIGS. 3A-3J show processes for manufacturing the semiconductor package of FIG. 2A. FIG. 4 shows a method flowchart for manufacturing semiconductor package according to a first embodiment of the invention.

Figure 3A:
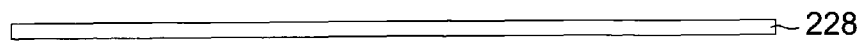
FIGS. 3A-3J show processes for manufacturing the semiconductor package of FIG. 2A.
Figure 4:
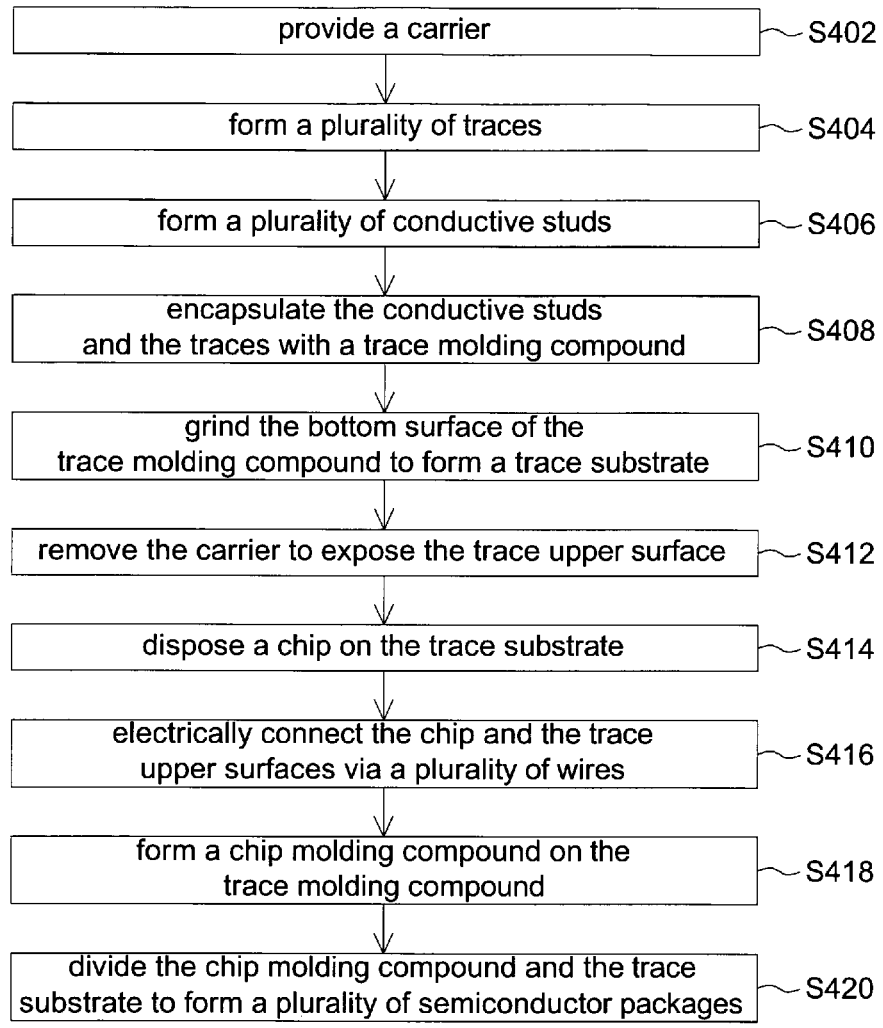
FIG. 4 shows a method flowchart for manufacturing semiconductor package according to a first embodiment of the invention.

Firstly, the method begins at step S402 as indicated in FIG. 3A, a carrier 228 is provided.

Figure 3B:
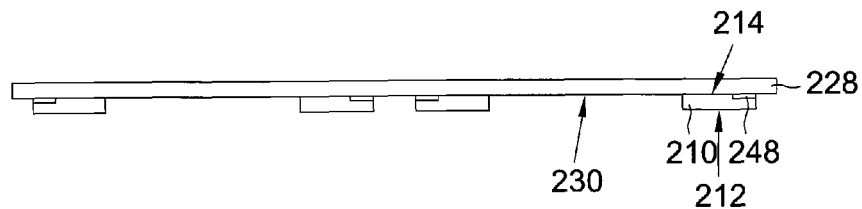

Next, the method proceeds to step S404 as indicated in FIG. 3B, a plurality of traces 210 and a plurality of trace pads 248 are formed on a carrier lower surface 230 of the carrier 228 preferably by electroplating. Each trace 210 has a trace lower surface 212 and a trace upper surface 214 which are opposite to each other, wherein the trace pads 248 are formed on the trace upper surface 214.

Figure 3C:

Then, the method proceeds to step S406 as indicated in FIG. 3C, a plurality of conductive studs 216 is formed on the trace lower surface 212 preferably by electroplating.

Figure 3D:
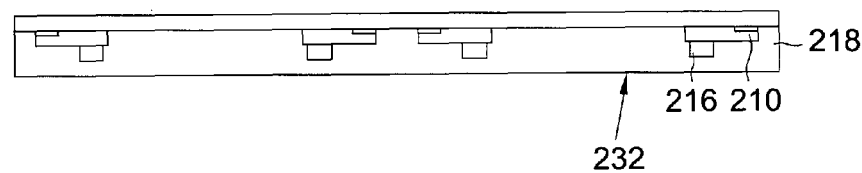

After that, the method proceeds to step S408 as indicated in FIG. 3D, the conductive studs 216 and the traces 210 are encapsulated by the trace molding compound 218.

Figure 3E:
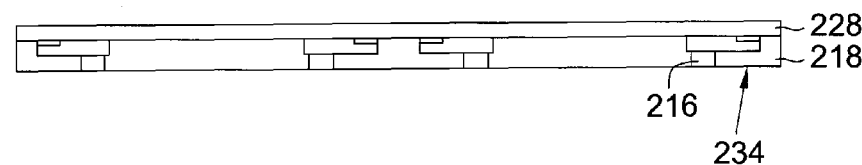

Following that, the method proceeds to step S410 as indicated in FIG. 3E, the bottom surface 232 (illustrated in FIG. 3D) of the trace molding compound 218 is preferably grinded to expose the lower surface 234 of each conductive stud.

Figure 3F:
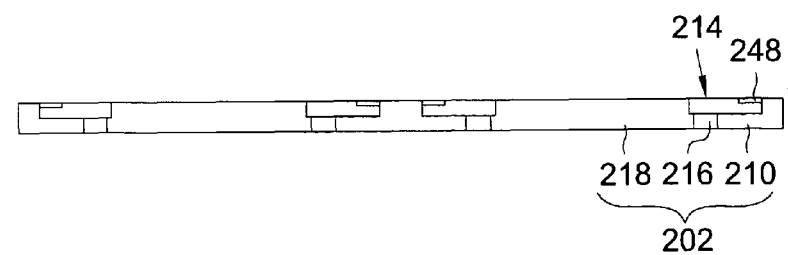

Afterwards, the method proceeds to step S412 as indicated in FIG. 3F, the carrier 228 of FIG. 3E is removed preferably by etching to expose the trace upper surface 214 and the trace pads 248, so that the conductive studs 216, the traces 210 and the trace molding compound 218 together form a trace substrate 202.

Figure 3G:
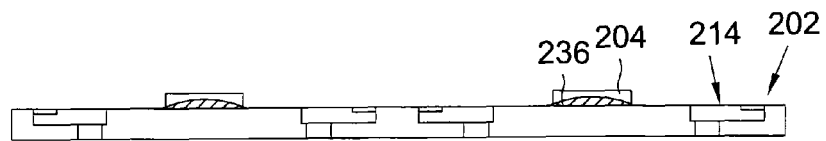

Then, the method proceeds to step S414 as indicated in FIG. 3G, an adhesive 236 fixes the chip 204 on the surface of the trace substrate 202 which exposes the trace upper surface 214.

Figure 3H:
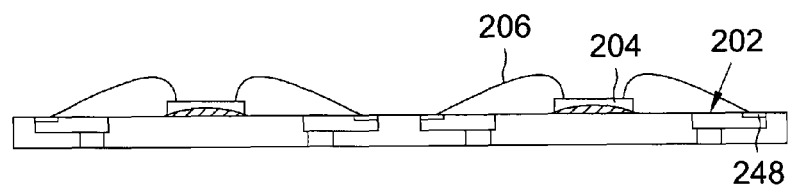

After that, the method proceeds to step S416 as indicated in FIG. 3H, the chip 204 and the trace pads 248 are electrically connected by a plurality of wires 206.

Figure 3I:
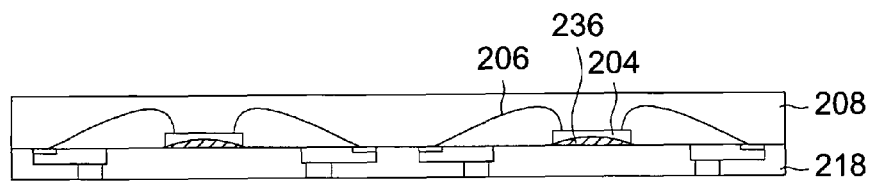

Following that, the method proceeds to step S418 as indicated in FIG. 3I, the chip molding compound 208 is formed on the trace molding compound 218, wherein the chip molding compound 208, preferably by molding process, encapsulates the chip 204, the adhesive 236 and the wire 206.

Figure 3J:
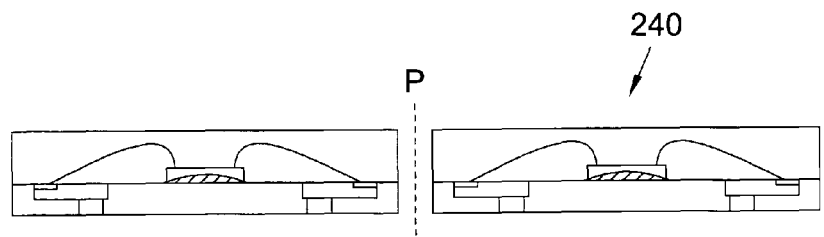

Lastly, the method proceeds to step S420 as indicated in FIG. 3J, the chip molding compound 208 and the trace substrate 202 are divided along a cutting path P, preferably by dicing, to form a plurality of semiconductor packages 240.

Second Embodiment

Figure 5:
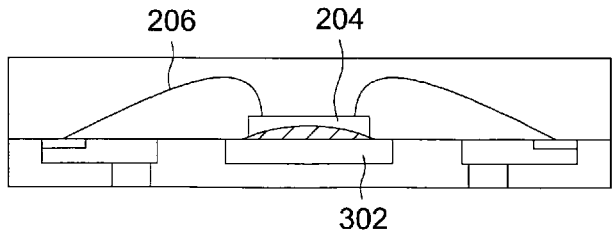
FIG. 5 shows a semiconductor package according to a second embodiment of the invention.

Referring to FIG. 5, a semiconductor package according to a second embodiment of the invention is shown. In the second embodiment, the same designations are used for elements similar to the first embodiment, and are not repeated here. The semiconductor package 300 of the second embodiment differs with the semiconductor package 200 of the first embodiment in that the semiconductor package 300 includes a chip base 302, preferably formed from copper.

Figure 6A:
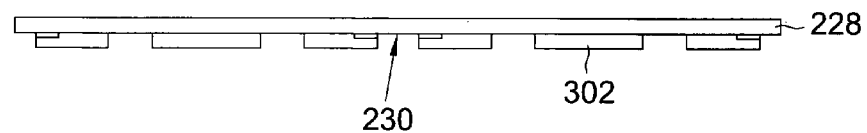
FIGS. 6A-6C show processes for manufacturing the semiconductor package of FIG. 5.
Figure 6B:
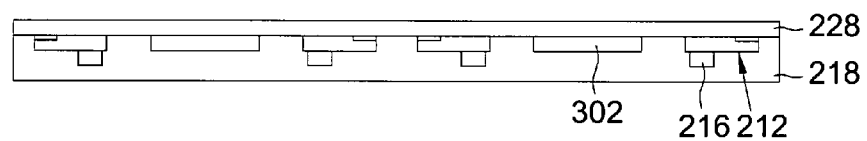
Figure 6C:
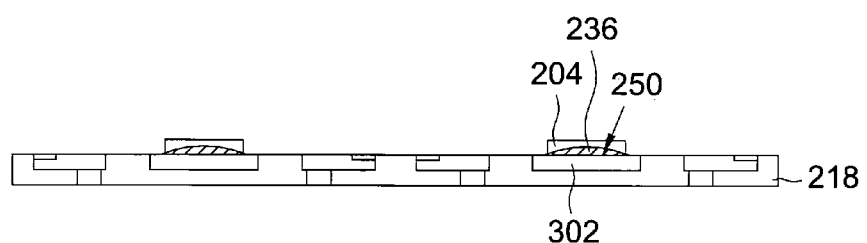
Figure 7:
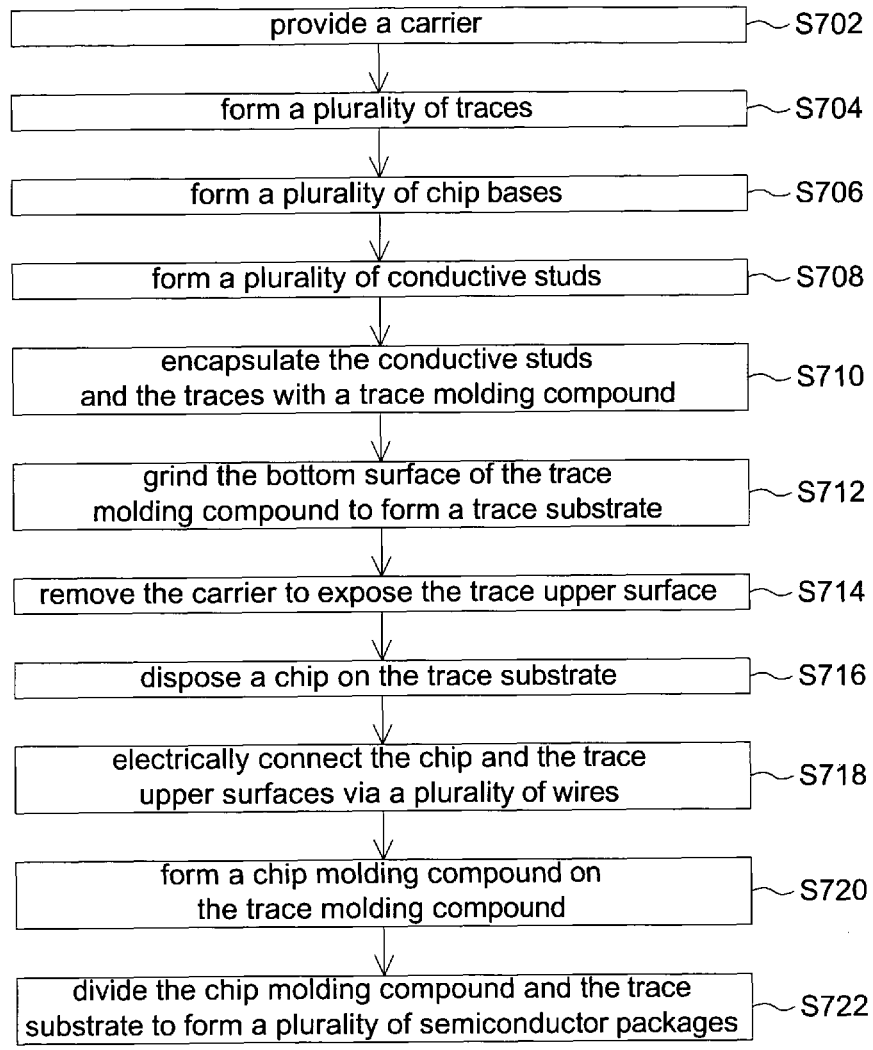
FIG. 7 shows a method flowchart for manufacturing semiconductor package according to a second embodiment of the invention.

The detailed processes of the method for manufacturing the semiconductor package of FIG. 5 are disclosed below. Referring to FIGS. 6A-6C and FIG. 7. FIGS. 6A-6C show processes for manufacturing the semiconductor package of FIG. 5. FIG. 7 shows a method flowchart for manufacturing semiconductor package according to a second embodiment of the invention.

As steps S702-S704 being similar to steps S402-S404 of FIG. 4 are not repeated here, the following elaboration starts with step S706.

Next, the method proceeds to step S706 as indicated in FIG. 6A, a plurality of chip bases 302 is formed on the carrier lower surface 230 of the carrier 228, preferably by electroplating and preferably formed together with the traces.

Then, the method proceeds to step S708, a plurality of conductive studs 216 is formed on the trace lower surface 212, wherein step S708 being similar to step S406 of FIG. 4 is not repeated here.

After that, the method proceeds to step S710 as indicated in FIG. 6B, the conductive studs 216, the traces 210 and the chip base 302 are encapsulated by the trace molding compound 218, preferably by molding process.

Afterwards, the method proceeds to steps S712-S714, the bottom surface of the trace molding compound 218 is preferably grinded, and the carrier 228 of FIG. 6A is removed, preferably by etching. Step S712-S714 being similar to steps S410-S412 of FIG. 4 are not repeated here.

Lastly, the method proceeds to step S716 as indicated in FIG. 6C, the adhesive 236 is used for fixing the chip 204 on the upper surface 250 of the chip base 302.

The following steps S718-S722 being similar to the steps S416-S420 of FIG. 4 are not repeated here.

Third Embodiment

Figure 8:
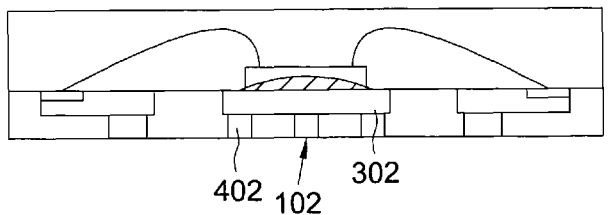
FIG. 8 shows a semiconductor package according to a third embodiment of the invention.

Referring to FIG. 8, a semiconductor package according to a third embodiment of the invention is shown. In the third embodiment, the same designations are used for elements similar to the second embodiment, and are not repeated here. The semiconductor package 400 of the third embodiment differs with the semiconductor package 300 of the second embodiment in that the semiconductor package 400 further includes a plurality of chip base supporting studs 402, preferably formed from copper.

Figure 9:
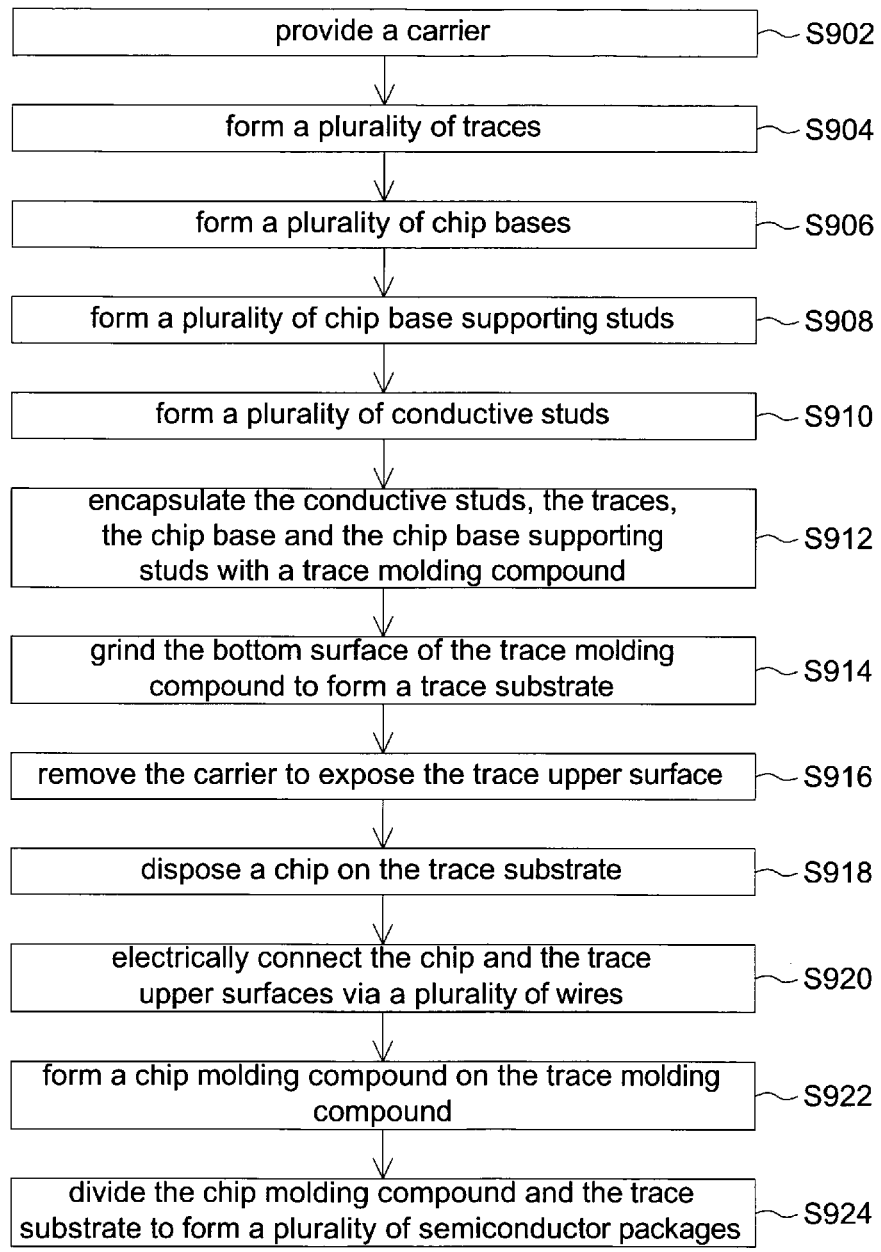
FIG. 9 shows a method flowchart for manufacturing semiconductor package according to a third embodiment of the invention.

Also, referring to FIG. 9, a method flowchart for manufacturing semiconductor package according to a third embodiment of the invention is shown. As steps S902-S906 being similar to the steps S702-S706 of FIG. 7 are not repeated here, the following elaboration starts with step S908.

Figure 10:
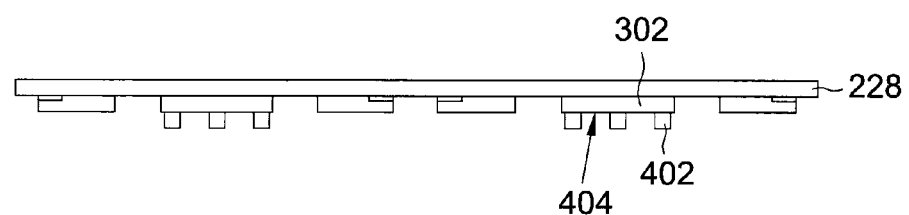
FIG. 10 shows a semiconductor package of the third embodiment with a chip base supporting stud.

Also, referring to FIG. 10, a semiconductor package of the third embodiment with a chip base supporting stud is shown. In step S908, a plurality of chip base supporting stud 402 is formed on the lower surface 404 of the chip base 302, preferably by electroplating and preferably formed together with the conductive studs.

The following steps S910-S914 being similar to steps S708-S712 of FIG. 7 and are not repeated here. Particularly, in step S912, the trace molding compound 218 further encapsulates the chip base supporting studs 402, preferably by molding process.

The chip base supporting studs 402 can be connected to an external circuit, such as the dummy pad of a circuit board, for enhancing the bond ability between the semiconductor package and the external circuit and increasing the reliability. Preferably, the wires also electrically connect the chip to the chip base supporting studs via the chip base, and subsequently the chip base supporting studs are further connected to an external circuit, such as a ground pad of a circuit board for grounding purpose.

The following steps S916-S924 being similar to steps S714-S722 of FIG. 7 are not repeated here.

Fourth Embodiment

Figure 11:
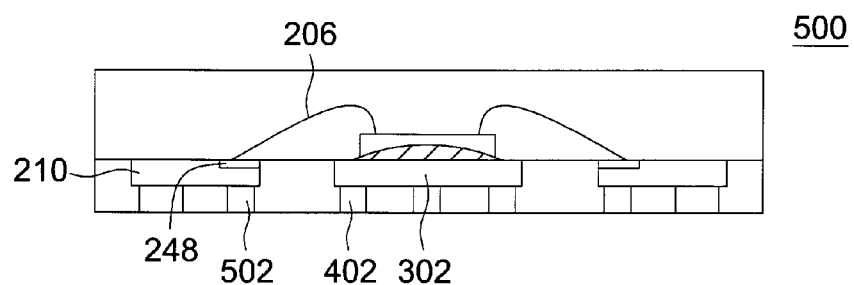
FIG. 11 shows a semiconductor package according to a fourth embodiment of the invention.

Referring to FIG. 11, a semiconductor package according to a fourth embodiment of the invention is shown. In the fourth embodiment, the same designations are used for elements similar to the third embodiment, and are not repeated here. The semiconductor package 500 of the fourth embodiment differs with the semiconductor package 400 of the third embodiment in that the semiconductor package 500 is a fan-out structure and further includes a plurality of trace supporting studs 502, preferably formed from copper and preferably formed together with the conductive studs.

As indicated in FIG. 11, the trace supporting studs 502 and the trace pads 248 are overlapped so as to increase the rigidity of the traces 210. To put it in a greater detail, when the wires 206 are wire-bonded on the trace pads 248 of the traces 210, due to the trace supporting studs 502 disposed on the semiconductor package 500, the wires 206 can support the traces 210 to resist the force applied by a wiring tool during the process of wire-bonding to avoid the traces 210 being over-bent and deformed to such an extent that the wires 206 cannot be connected to the trace pads 248.

Figure 12:
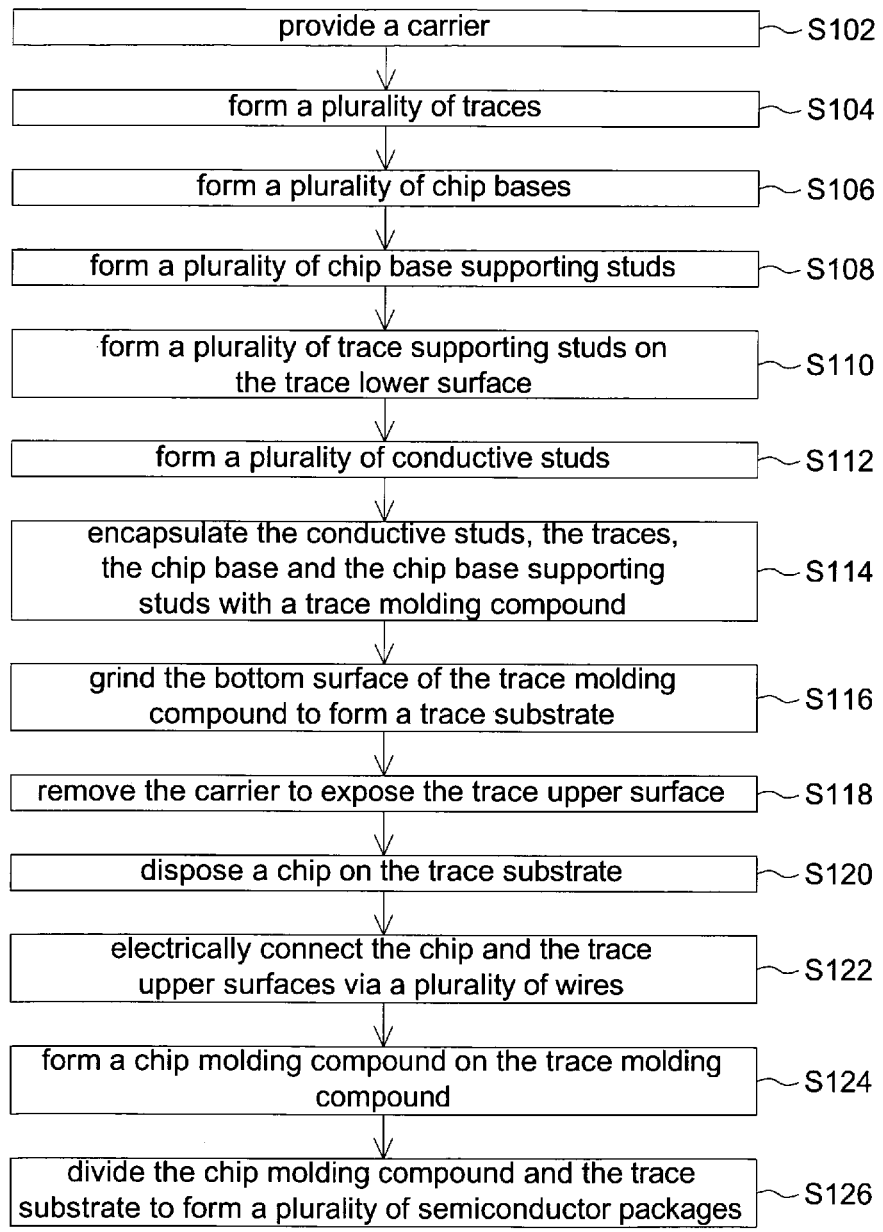
FIG. 12 shows a method flowchart for manufacturing semiconductor package according to a fourth embodiment of the invention.

Also, referring to FIG. 12, a method flowchart for manufacturing semiconductor package according to a fourth embodiment of the invention is shown. As steps S102-S108 being similar to steps S902-S908 of FIG. 9 are not repeated here, the following elaboration starts with step S110.

Figure 13:
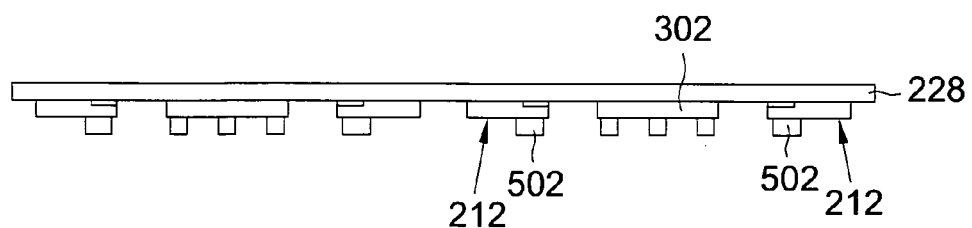
FIG. 13 shows a semiconductor package of the present embodiment of the invention with a plurality of trace supporting studs.

Also, referring to FIG. 13, a semiconductor package of the present embodiment of the invention with a plurality of trace supporting studs is shown. In step S110, a plurality of trace supporting studs 502 is formed on the trace lower surface 212. Alternatively, the plurality of trace supporting studs 502 can also be formed in step 106 together with the conductive studs.

The following steps S112-S116 being similar to steps S910-S914 of FIG. 9 are not repeated here. Particularly, in step S114, the trace molding compound 218 further encapsulates the trace supporting studs 502, preferably by molding process.

The following steps S118-S126 being similar to steps S916-S924 of FIG. 9 are not repeated here.

Fifth Embodiment

Figure 14:
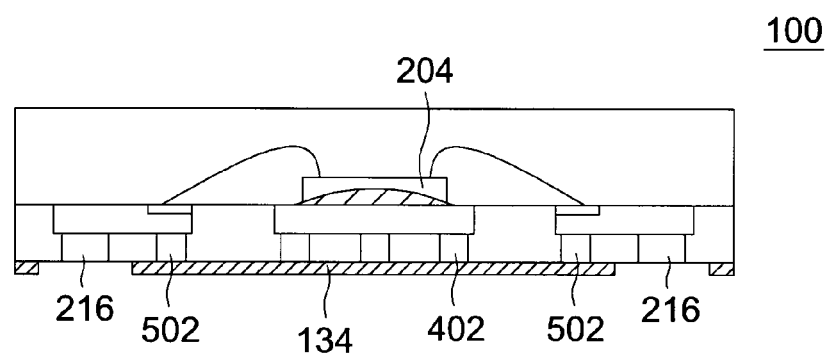
FIG. 14 shows a semiconductor package according to a fifth embodiment of the invention.

Referring to FIG. 14, a semiconductor package according to a fifth embodiment of the invention is shown. In the fifth embodiment, the same designations are used for elements similar to the fourth embodiment, and are not repeated here. The semiconductor package 100 of fifth embodiment differs with the semiconductor package 500 of the fourth embodiment in that the semiconductor package 100 further includes an insulation layer 134, preferably a soldermask layer or a polyimide layer.

Preferably, the insulation layer 134 prevents the chip base supporting stud 402 and the trace supporting studs 502 from external pollution lest the quality of the electrical connection between the semiconductor package 100 and external electronic devices might be affected. Preferably, the insulation layer 134 electrically isolates the chip base supporting stud 402 from an external circuit, such as a circuit board (not illustrated), to avoid the occurrence of short-circuiting between the chip base supporting stud 402 and the external circuit.

Figure 15:
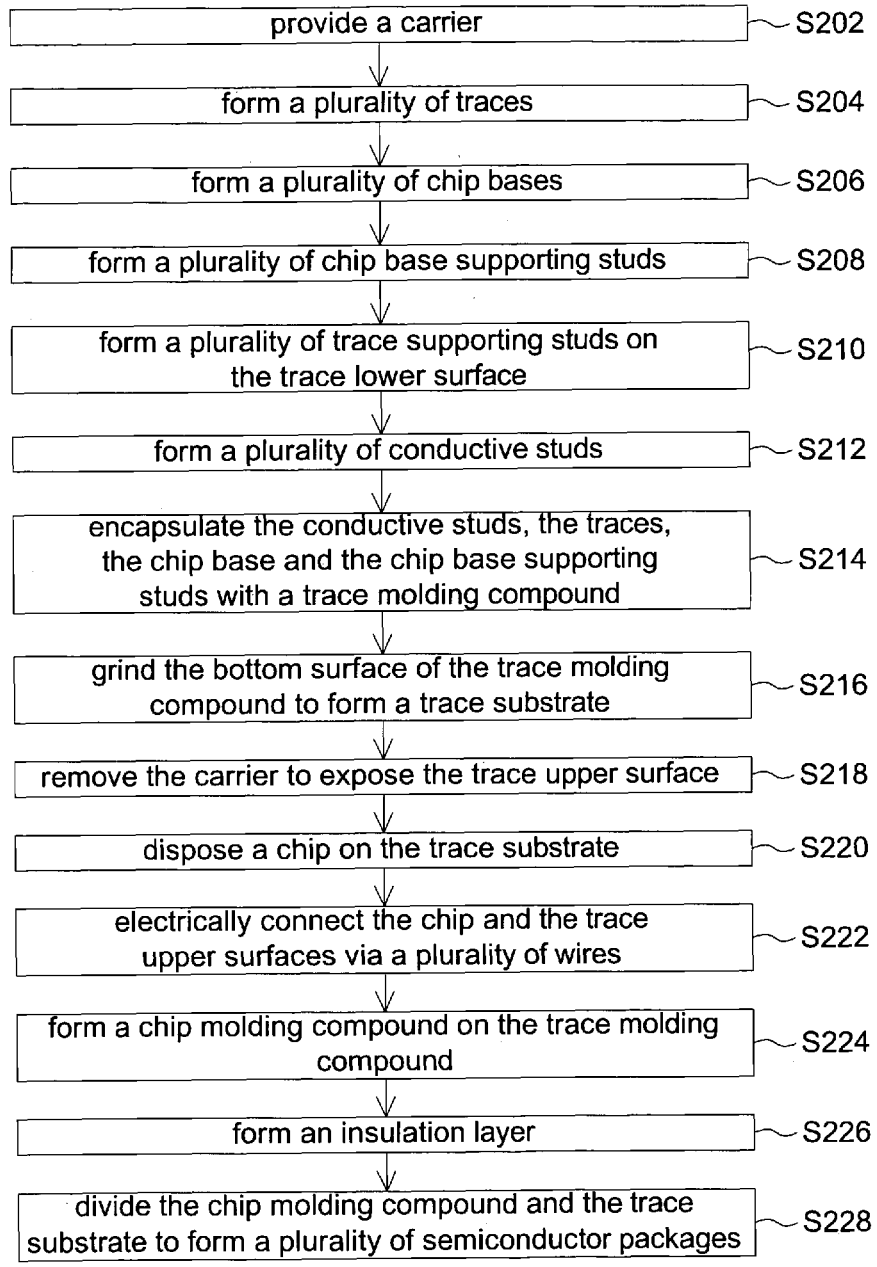
FIG. 15 shows a method flowchart for manufacturing semiconductor package according to a fifth embodiment of the invention.

Also, referring to FIG. 15, a method flowchart for manufacturing semiconductor package according to a fifth embodiment of the invention is shown. As steps S202-S224 being similar to steps S102-S124 of FIG. 12 are not repeated here, the following elaboration starts with step S226.

Figure 16:
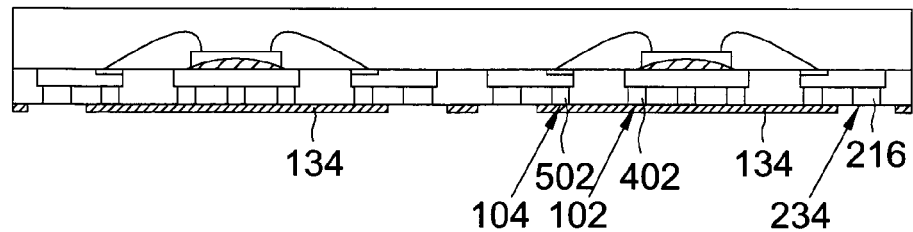
FIG. 16 shows a semiconductor package of the present embodiment of the invention with an insulation layer being formed during the manufacturing process.

Also, referring to FIG. 16, a semiconductor package of the present embodiment of the invention with an insulation layer being formed during the manufacturing process is shown. In step S226, the insulation layer 134 is formed on the surface of the trace molding compound 218 which exposes the conductive stud lower surface 234, and covers the lower surfaces 102 of the chip base supporting studs 402 and the lower surfaces 104 of the trace supporting studs 502. Preferably, the insulation layer is formed by spin-coating or screen-printing process. Alternatively, it is formed by lithography process. Preferably, the insulation layer 134 exposes the conductive stud lower surfaces 234 so that the conductive studs 216 and external circuit can be electrically connected.

The following step S228 being similar to step S126 of FIG. 12 is not repeated here.

Sixth Embodiment

Figure 17:
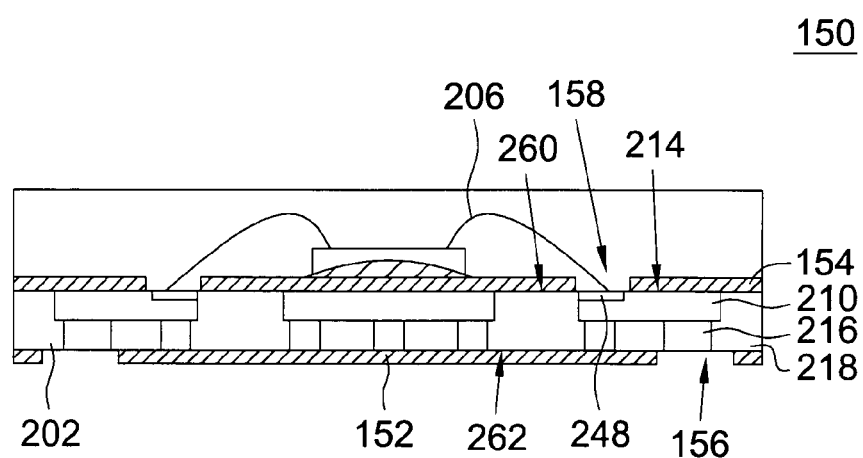
FIG. 17 shows a semiconductor package according to a sixth embodiment the invention.

Referring to FIG. 17, a semiconductor package according to a sixth embodiment the invention is shown. In the sixth embodiment, the same designations are used for elements similar to the fifth embodiment, and are not repeated here. The semiconductor package 150 of the sixth embodiment differs with the semiconductor package 200 of the fifth embodiment in that the semiconductor package 150 includes two insulation layers 152 and 154, preferably soldermask layers or polyimide layers.

Figure 18:
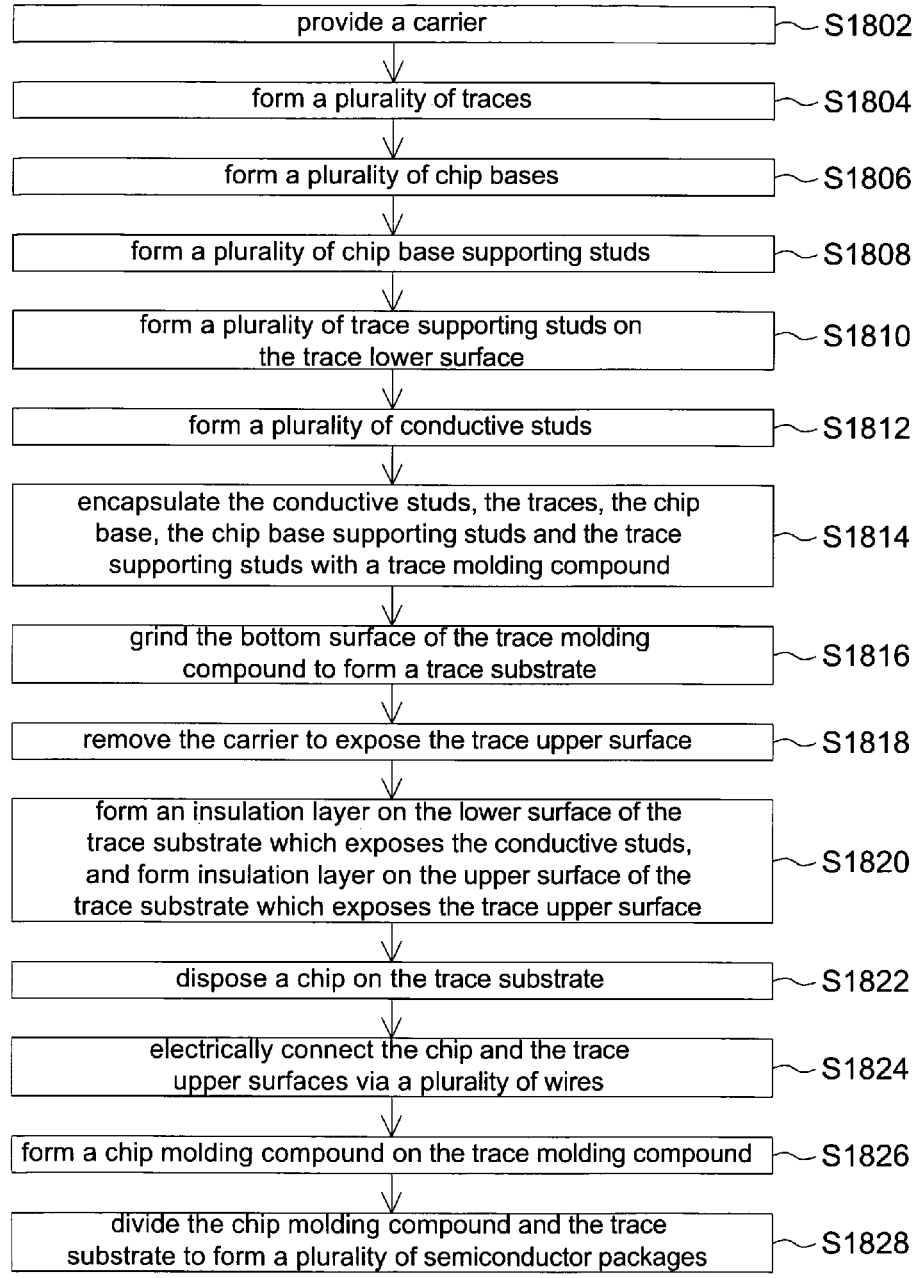
FIG. 18 shows a method flowchart for manufacturing semiconductor package according to a sixth embodiment of the invention.

Also, referring to FIG. 18, a method flowchart for manufacturing semiconductor package according to a sixth embodiment of the invention is shown.

As steps S1802-S1818 being similar to steps S202S218 of FIG. 15 are not repeated here, the following elaboration starts with step S1820.

In step S1820, the insulation layer 152 (the insulation layer 152 is illustrated in FIG. 17) is formed on the lower surface 262 of the trace substrate 202 which exposes the conductive studs 216, and the insulation layer 154 is formed on the upper surface 260 of the trace substrate 202 which exposes the trace upper surface 214. Preferably, the insulation layers 152 and 154 are formed by spin-coating or screen-printing. Alternatively, they are formed by lithography process. The insulation layer 152 and has a plurality of openings 156, each correspondingly exposing the lower surface 262 of each conductive stud 216. The insulation layer 154 and has a plurality of openings 158 correspondingly exposing the trace pads 248. Thus, the amount of electroless nickel/immersion gold (ENIG) subsequently used for coating the lower surface 262 of the conductive studs 216 and the trace upper surface 214 is reduced, the trace upper surface 214 is protected and the substrate rigidity is enhanced.

The following step S1822-step S1826 being similar to steps S220-S224 of FIG. 15 are not repeated here.

The following step S1828 being similar to step S228 of FIG. 15 is not repeated here.

Seventh Embodiment

Figure 19:
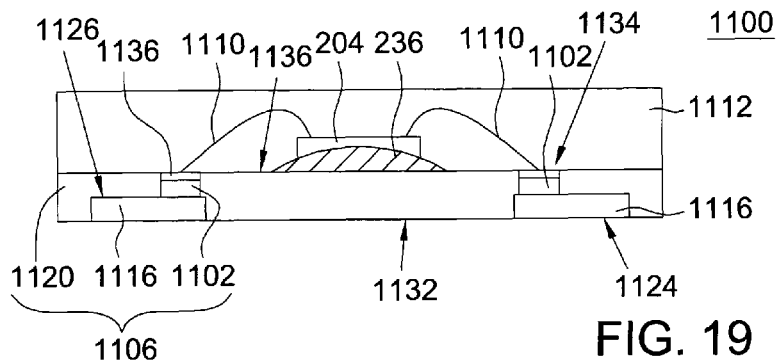
FIG. 19 shows a semiconductor package according to a seventh embodiment of the invention.

Referring to FIG. 19, a semiconductor package according to a seventh embodiment of the invention is shown. The semiconductor package 1100 of seventh embodiment differs with the semiconductor package 200 of the first embodiment in that the chip 204 is disposed on the surface of the trace substrate 1106 which exposes the conductive studs 1102.

The semiconductor package 1100 includes a trace substrate 1106, a chip 204, a plurality of wires 1110, preferably gold wire, a chip molding compound 1112, preferably molding compound, and an adhesive 236, preferably polymer epoxy.

The trace substrate 1106 includes a plurality of traces 1116, a plurality of conductive studs 1102 and the trace molding compound 1120. Each trace 1116 has a trace upper surface 1126 and a trace lower surface 1124 opposite to each other, wherein the conductive studs 1102 have a conductive stud upper surface 1134.

The trace substrate 1106 includes a plurality of traces 1116, a plurality of conductive studs 1102 and the trace modling compound 1120. Each trace 1116 has a trace upper surface 1126 and a trace lower surface 1124 opposite to each other, wherein the conductive studs 1102 have a conductive stud upper surface 1134.

The conductive studs 1102 are formed on the trace upper surface 1126. The trace molding compound 1120 encapsulates the conductive studs 1102 and the trace 1116, and exposes the conductive stud upper surface 1134 and the trace lower surface 1124. The trace 1116 and the conductive studs 1102 are preferably made from copper and preferably formed by electroplating. The adhesive 236 fixes the chip 204 on the surface of the trace substrate 1106 which exposes the conductive studs 1102.

Figure 20:
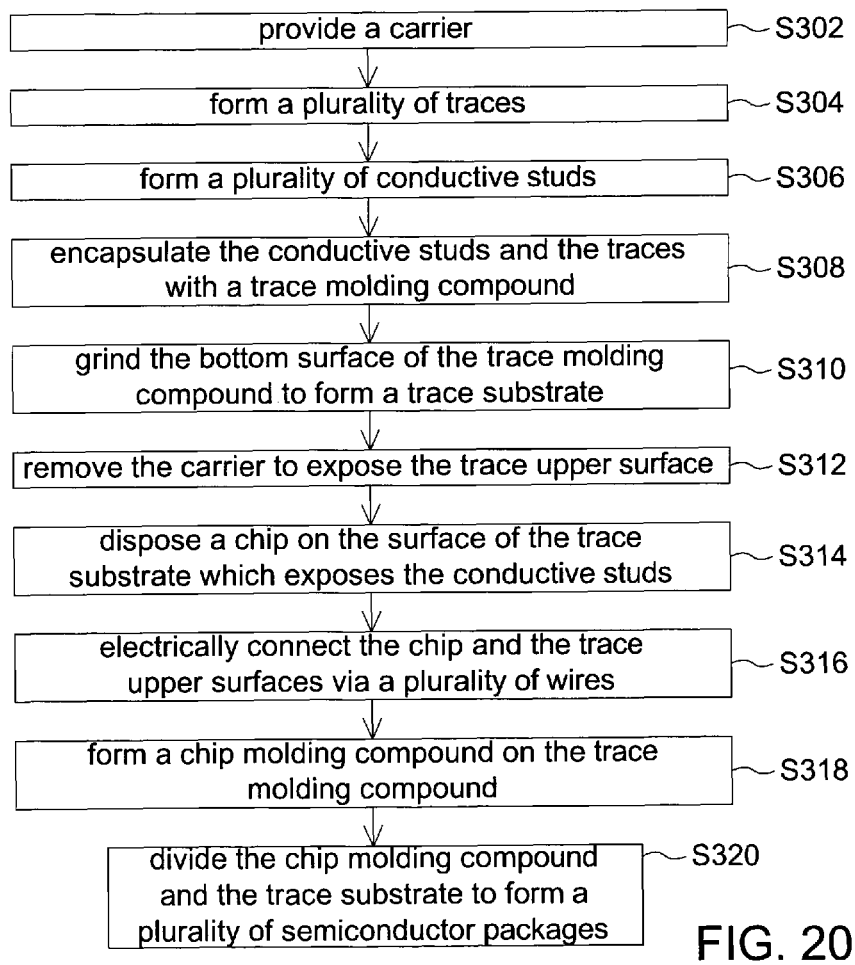
FIG. 20 shows a method flowchart for manufacturing semiconductor package according to a seventh embodiment of the invention.

Referring to FIG. 20, a method flowchart for manufacturing semiconductor package according to a seventh embodiment of the invention is shown. Steps S302-S312 being similar to steps S402-S412 of FIG. 4 are not repeated here.

In step S314, the chip 204 is disposed on the surface of the trace substrate 1106 which exposes the conductive stud upper surface 1134.

In step S316, the chip 204 and the pads 1136 on the conductive studs 1102 are electrically connected by a plurality of wires 206.

The following steps S318-S320 being similar to steps S418-S420 of FIG. 4 are not repeated here.

Figure 21:
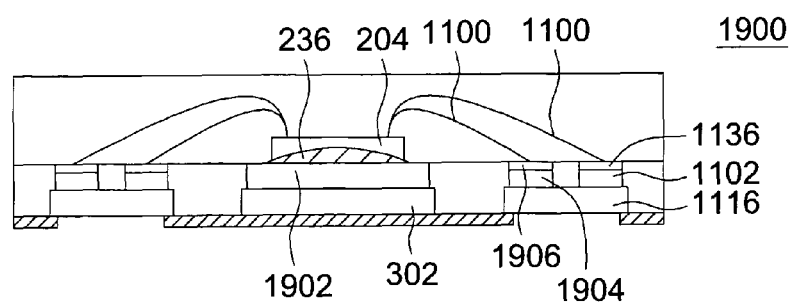
FIG. 21 shows a semiconductor package according to another embodiment of the invention.

Referring to FIG. 21, a semiconductor package according to another embodiment of the invention is shown. The semiconductor package 1900 may include a chip 204, a plurality of traces 1116, a plurality of wires 1110, a plurality of conductive studs 1102, a plurality of trace supporting studs 1904, a plurality of pads 1136, a chip base 302 and a plurality of chip base supporting studs 1902. The chip base supporting studs 1902 are disposed on the lower surface of the chip base 302. The adhesive 236 fixes the chip 204 on the upper surface of the chip base 302. The trace molding compound (not designated) encapsulates the chip base 302 and chip base supporting stud 1902. The lower surface of the trace molding compound exposes the lower surface of the chip base supporting stud 1902.

The conductive studs 1102 and the trace supporting stud 1904 can be disposed on the trace 1116. A plurality of wires 1100 electrically connects the chip 204 and the pads 1136 on the conductive studs 1102, and further electrically connects the chip 204 and the pads 1906 on the trace supporting stud 1904.

Eighth Embodiment

Figure 22:
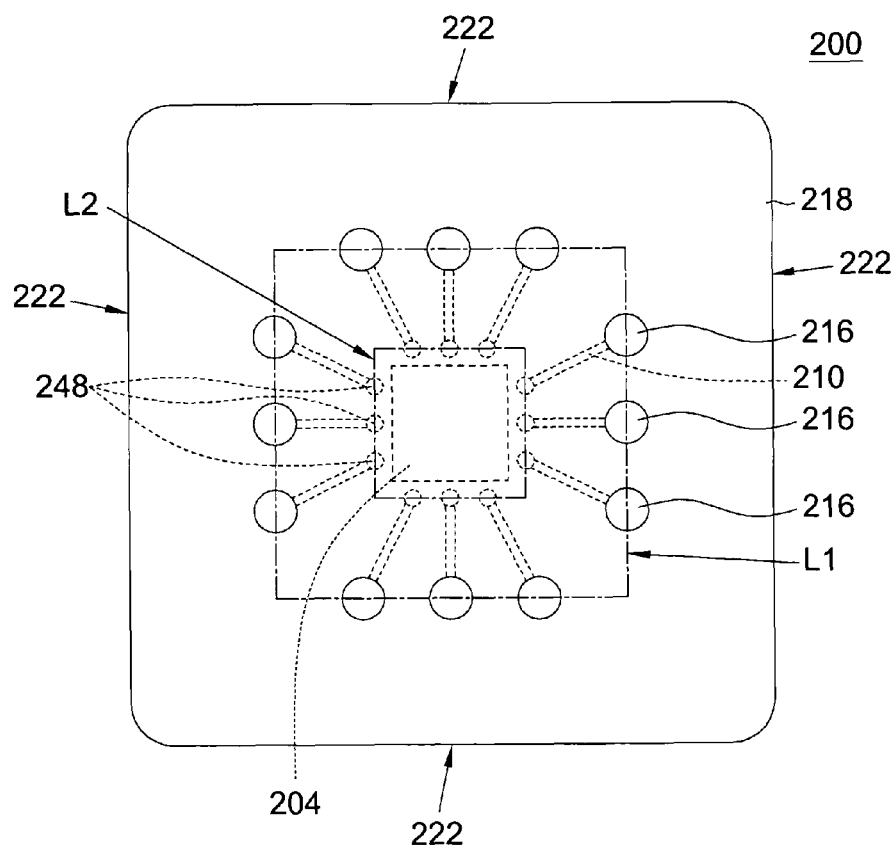
FIG. 22 shows a bottom view of the semiconductor package of FIG. 2A.

Referring to FIG. 22, a bottom view of the semiconductor package of FIG. 2A is shown. The conductive studs 216 are arranged along a first border L1, that is, the conductive studs 216 are arranged in one row. The trace pads 248 are arranged along a second border L2, that is, the trace pads 248 are arranged in one row. Preferably, the first border L1 and the second border L2 both surround the chip.

Figure 23:
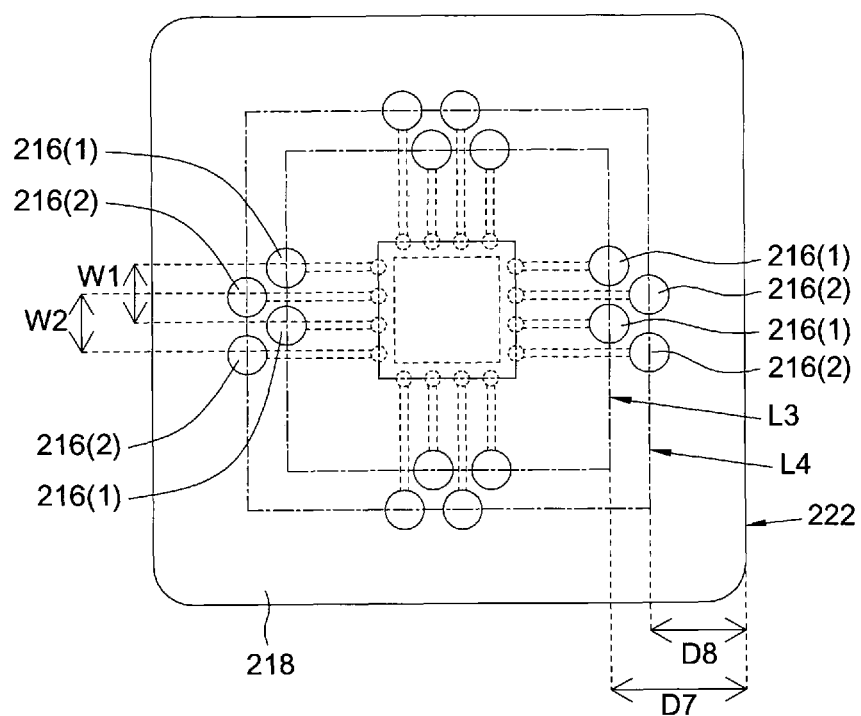
FIG. 23 shows a bottom view of a semiconductor package according to an eighth embodiment of the invention.

Referring to FIG. 23, a bottom view of a semiconductor package according to an eighth embodiment of the invention is shown. In the eighth embodiment, the same designations are used for elements similar to the first embodiment, and are not repeated here. The semiconductor package 600 of the eighth embodiment differs with the semiconductor package 200 of the first embodiment in that the conductive studs 216 of the semiconductor package 600 are arranged in multiple rows.

The conductive studs 216 of the semiconductor package 600 include a plurality of first conductive studs 216(1) and a plurality of second conductive studs 216(2). The first conductive studs 216(1) are arranged along a third border L3, and the second conductive studs 216(2) are arranged along a fourth border L4. The distance D7 from the third border L3 to the lateral side 222 differs with the distance D8 from the fourth border L4 to the lateral side 222, so that the conductive studs 216 are arranged in two rows. Preferably, the third border L3 and the fourth border L4 both surround the chip.

Preferably, as indicated in FIG. 23, the first conductive studs 216(1) and the second conductive studs 216(2) are interlaced.

Preferably, by making the first conductive studs 216(1) and the second conductive studs 216(2) interlaced, the semiconductor package can accommodate more conductive studs 216. That is, the number of the I/O contacts of the semiconductor package can be greatly increased.

Preferably, the width W1 between two adjacent first conductive studs 216(1) differs with the width W2 between two adjacent second conductive studs 216(2).

In the present embodiment of the invention, the width W1 between two adjacent first conductive studs 216(1) differs with the width W2 between two adjacent second conductive studs 216(2). However, in other embodiments, the width W1 can be equal to the width W2, making the design of the distribution of the first conductive studs 216(1) and the second conductive studs 216(2) more flexible.

Ninth Embodiment

Figure 24:
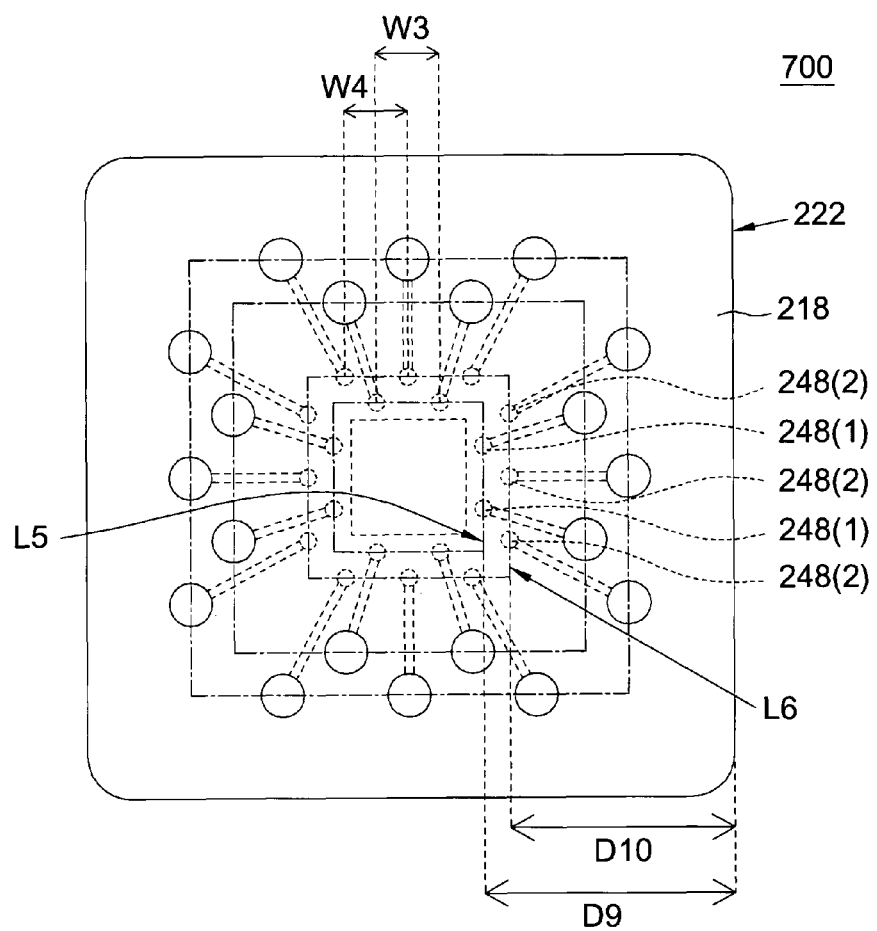
FIG. 24 shows a semiconductor package according to a ninth embodiment of the invention.

Referring to FIG. 24, a semiconductor package according to a ninth embodiment of the invention is shown. In the ninth embodiment, the same designations are used for elements similar to the eighth embodiment, and are not repeated here. The semiconductor package 700 of the ninth embodiment differs with the semiconductor package 600 of the eighth embodiment in that the trace pads 248 of the semiconductor package 700 are arranged in multiple rows.

The trace pads 248 of the semiconductor package 700 include a plurality of first trace pads 248(1) and a plurality of second the trace pads 248(2). The first trace pads 248(1) are arranged along a fifth border L5, and the second the trace pads 248(2) are arranged along a sixth border L6. The distance D9 from the fifth border L5 to the lateral side 222 of the trace molding compound 218 differs with the distance D10 from the sixth border L6 to the lateral side 222 of the trace molding compound 218, so that the trace pads 248 are arranged in two rows. Preferably, both the fifth border L5 and the sixth border L6 surround the chip.

Preferably, as indicated in FIG. 24, the first trace pads 248(1) and the second the trace pads 248(2) are interlaced.

Preferably, by making the first trace pads 248(1) and the second the trace pads 248(2) interlaced, the semiconductor package 700 can accommodate more trace pads 248. That is, the number of the I/O contacts of the semiconductor package 700 can be greatly increased.

Besides, the width W3 between two adjacent first trace pads 248(1) differs with the width W4 between two adjacent second trace pads 248(2). However, in other embodiments, the width between two adjacent first trace pads 248(1) can also be equal to the width between two adjacent second trace pads 248(2), making the design of the distribution of the first trace pads 248(1) and the second the trace pads 248(2) more flexible.

Tenth Embodiment

Figure 25:
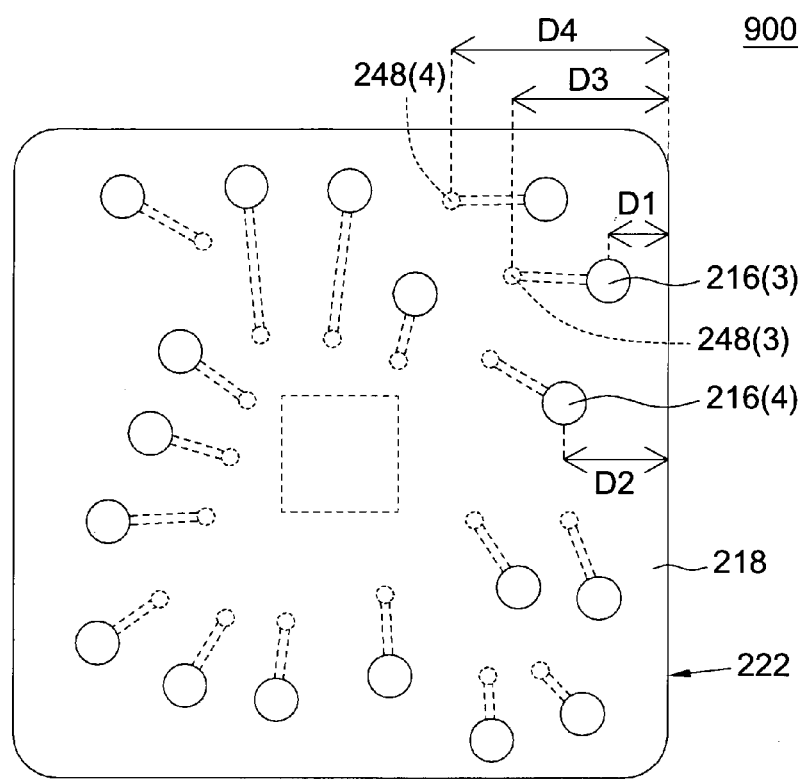
FIG. 25 shows a semiconductor package according to a tenth embodiment of the invention.

Referring to FIG. 25, a semiconductor package according to a tenth embodiment of the invention is shown. In the tenth embodiment, the same designations are used for elements similar to the first embodiment, and are not repeated here. The semiconductor package 900 of the tenth embodiment differs with the semiconductor package 200 of the first embodiment in that the conductive studs 216 and the trace pads 248 of the semiconductor package 900 are irregularly arranged.

To put it in a greater detail, one of the conductive studs 216 (such as the conductive studs 216(3)) of the semiconductor package 900 and the lateral side 222 of the trace molding compound 218 are separated by a first distance D1. Another one of the conductive studs 216 (such as the conductive stud 216(4)) and the lateral side 222 of the trace molding compound 218 are separated by a second distance D2. The first distance D1 differs with the second distance D2. That is, the conductive studs 216 of the present embodiment of the invention can be irregularly arranged.

Preferably, one of the trace pads 248 (such as the trace pads 248(3)) and the lateral side 222 of the trace molding compound 218 are separated by a third distance D3, and another trace pad 248 (such as the trace pas 248(4)) and the lateral side 222 are separated by a fourth distance D4. The third distance D3 differs with the fourth distance D4. That is, the trace pads 248 of the present embodiment of the invention can be irregularly arranged.

According to the foregoing disclosure of the sixth embodiment to the ninth embodiment, the conductive studs and the trace are preferably formed by electroplating, so the traces can be arbitrarily extended and the conductive studs can be arranged in many different patterns such that the flexibility in the design of the semiconductor package of the invention is increased.

The semiconductor package and the method for manufacturing the semiconductor package and the trace substrate and the method for manufacturing the trace substrate disclosed in the above embodiments of the invention have many advantages exemplified below:

(1). The trace supporting studs enhances the rigidity of the trace. Therefore, during the process of wire-bonding the wires on the trace pads of the trace, the trace will not be overbent and deformed due to the force applied by a wiring tool, hence improving the quality of wire-bonding.

(2). As the conductive studs are interlaced, the semiconductor package can accommodate more conductive studs. That is, the number of the I/O contacts of the semiconductor package is greatly increased.

(3). The conductive studs and the trace pads can be arranged in many rows, so that the number of the I/O contacts of the semiconductor package greatly increases.

(4). As the conductive studs and the trace are preferably formed by way of electroplating, the trace can be arbitrarily extended and the conductive studs can be arranged in many patterns, making the design of the semiconductor package more flexible.

(5). The trace pads are disposed near the chip, so that the wire connects the chip and the trace pads via a shortest distance to avoid the wires 206 being short-circuited.

(6). As the trace pads are no more limited to be disposed on the peripheral of the semiconductor package, the number of the I/O contacts of the semiconductor package can be greatly increased.

(7). The trace pads and the conductive studs are protected inside the molding compound, and will not be eroded easily.

(8). The trace and the conductive studs are preferably formed by way of electroplating. In comparison to the generally known lead frame, the traces and the conductive studs have smaller sizes and volumes. Thus, the semiconductor package of the invention is conformed to the trend of lightweight, compactness and slimness.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method for a semiconductor package, comprising:
   providing a carrier having a carrier upper surface and a carrier lower surface opposite the carrier upper surface;
   forming a plurality of traces on the carrier, each trace having a trace upper surface and a trace lower surface opposite the trace upper surface, wherein the trace upper surface adjoins the carrier lower surface;
   forming a plurality of studs on the plurality of traces, each stud having a stud upper surface and a stud lower surface opposite the stud upper surface, wherein the stud upper surface adjoins the trace lower surface;
   forming a trace molding compound layer on the carrier by a first molding process, the trace molding compound layer having a first surface and a second surface opposite the first surface, wherein the trace molding compound layer encapsulates the plurality of traces and studs between the first and second surface of the trace molding compound layer, the first surface of the trace molding compound layer adjoins the carrier lower surface;
   removing the carrier from the trace molding compound layer to expose an etched surface of the trace molding compound layer and the trace upper surface;
   disposing at least a chip on the etched surface of the trace molding compound layer and connecting the chip to the trace upper surface; and
   forming a chip molding compound layer on the etched surface of the trace molding compound layer by a second molding process substantially similar to the first molding process, the chip molding compound layer having a first surface and a second surface opposite the first surface, wherein the chip molding compound layer encapsulates the chip between the first and second surface of the chip molding compound layer, the second surface of the chip molding compound layer adjoins the etched surface of the trace molding compound layer and the trace upper surface, and the chip molding compound layer and the trace molding compound layer are formed of substantially the same molding compound material.

2. The manufacturing method according to claim 1, further comprising:
   forming a plurality of trace pads on the traces.

3. The manufacturing method according to claim 1, wherein the traces are formed by electroplating from the carrier lower surface.

4. The manufacturing method according to claim 1, wherein the studs are formed by electroplating from the trace lower surface.

5. The manufacturing method according to claim 2, further comprising:
   forming a plurality of trace supporting studs on the trace lower surfaces, each having a stud upper surface and a stud lower surface opposite the stud upper surface, wherein each trace supporting stud corresponds to one trace pad and is formed on the trace lower surface opposite the corresponding trace pad, the stud upper surface adjoins the trace lower surface;
   wherein the trace molding compound layer further encapsulates the trace supporting studs, the trace supporting stud lower surfaces are exposed on the second surface of the trace molding compound layer.

6. The manufacturing method according to claim 5, further comprising:
   forming an insulation layer on second surface of the trace molding compound layer and the lower surfaces of the trace supporting studs, and exposing the lower surfaces of the studs through a plurality of openings in the insulation layer.

7. The manufacturing method according to claim 2, further comprising:
   forming an insulation layer on the etched surface of the trace molding compound layer after removing the carrier, wherein the insulation layer has a plurality of openings corresponding to and exposing the trace pads.

8. The manufacturing method according to claim 1, further comprising:
   forming at least a chip base on the lower surface of the carrier, each chip base having a chip base upper surface and a chip base lower surface;
   wherein the trace molding compound layer further encapsulates the chip base and after the step of removing the carrier, the chip is disposed on the chip base.

9. The manufacturing method according to claim 8, further comprising:
   forming an insulation layer on the etched surface of the trace molding compound layer after removing the carrier, wherein the insulation layer has a plurality of openings corresponding to and exposing the trace pads and the chip base.

10. The manufacturing method according to claim 8, further comprising:
    forming a plurality of chip base supporting studs on the chip base lower surface, each chip base supporting stud having a stud upper surface and a stud lower surface, the stud upper surfaces adjoin the chip base lower surface;
    wherein the trace molding compound layer further encapsulates the chip base supporting studs and the chip base supporting studs are exposed on the second surface of the trace molding compound layer.

11. The manufacturing method according to claim 10, further comprising:
    forming an insulation layer on the second surface of the trace molding compound layer and the lower surfaces of the chip base supporting studs and exposing the lower surfaces of the studs through a plurality of openings in the insulation layer.

12. The manufacturing method according to claim 1, wherein the step of forming the trace molding compound layer comprising:
    encapsulating the traces and the studs with a molding compound disposed on the carrier lower surface;
    grinding the molding compound to expose the second a grinded surface of the trace molding compound layer and expose the lower surfaces of the studs.

13. A manufacturing method for a semiconductor package, comprising:
    providing a carrier having a carrier upper surface and a carrier lower surface opposite the carrier upper surface;
    forming a plurality of traces on the carrier, each trace having a trace upper surface and a trace lower surface opposite the trace upper surface, wherein the trace upper surface adjoins the carrier lower surface;
    forming a plurality of studs on the plurality of traces, each stud having a stud upper surface and a stud lower surface opposite the stud upper surface, wherein the stud upper surface adjoins the trace lower surface;
    forming a trace molding compound layer on the carrier by a first molding process, the trace molding compound layer having a first surface and a second surface opposite the first surface, wherein the trace molding compound layer encapsulates the plurality of traces and the studs between the first and second surface of the trace molding compound layer, the first surface of the trace molding compound adjoins the carrier lower surface;

removing the carrier from the trace molding compound layer to expose an etched surface of the trace molding compound layer and the trace upper surface;

providing at least a chip;

forming a chip molding compound layer, the chip molding compound layer having a first surface and a second surface opposite the first surface, wherein the chip molding compound layer encapsulates the chip between the first and second surface of the chip molding compound layer;

disposing the chip molding compound layer on the etched surface of the trace molding compound layer, wherein the second surface of the chip molding compound layer adjoins the first surface of the trace molding compound layer and the trace upper surface, the chip molding compound layer and the trace molding compound layer are formed of substantially the same molding compound material.

* * * * *